(12) United States Patent
Castrillon et al.

(10) Patent No.: US 11,863,204 B2
(45) Date of Patent: Jan. 2, 2024

(54) DECODER CIRCUIT INCLUDING DECODERS WITH RESPECTIVE PERFORMANCE AND POWER LEVELS AND DECODING RESPECTIVE SUBSETS OF CODEWORDS OF RECEIVED DATA

(71) Applicant: Marvell Asia Pte Ltd., Singapore (SG)

(72) Inventors: Mario A. Castrillon, Córdoba (AR); Damián A. Morero, Córdoba (AR); Genaro Bergero, Córdoba (AR); Cristian Cavenio, Córdoba (AR); Teodoro Goette, Córdoba (AR); Martin Asinari, Córdoba (AR); Ramiro R. Lopez, Córdoba (AR); Mario R. Hueda, Córdoba (AR)

(73) Assignee: Marvell Asia Pte Ltd., Singapore (SG)

( * ) Notice: Subject to any disclaimer, the term of this patent is extended or adjusted under 35 U.S.C. 154(b) by 0 days.

(21) Appl. No.: 17/882,136

(22) Filed: Aug. 5, 2022

(65) Prior Publication Data
US 2022/0385310 A1 Dec. 1, 2022

Related U.S. Application Data

(63) Continuation of application No. 16/778,918, filed on Jan. 31, 2020, now Pat. No. 11,424,766.

(51) Int. Cl.
*H03M 13/37* (2006.01)
*H03M 13/11* (2006.01)
*H03M 13/01* (2006.01)
*H03M 13/00* (2006.01)

(52) U.S. Cl.
CPC ..... *H03M 13/3707* (2013.01); *H03M 13/015* (2013.01); *H03M 13/1128* (2013.01); *H03M 13/1168* (2013.01); *H03M 13/616* (2013.01)

(58) Field of Classification Search
CPC .................................. H03M 13/3707
See application file for complete search history.

(56) References Cited

U.S. PATENT DOCUMENTS

| | | | |
|---|---|---|---|
| 6,606,724 B1 * | 8/2003 | Krieger | H03M 13/3776 714/755 |
| 6,947,109 B2 | 9/2005 | Lee | |
| 6,948,109 B2 | 9/2005 | Coe | |
| 8,171,368 B1 * | 5/2012 | Wu | H03M 13/45 714/752 |
| 8,347,172 B2 | 1/2013 | Kwon et al. | |

(Continued)

OTHER PUBLICATIONS

Chen, J_ et al., "Reduced-Complexity Decoding of LDPC Codes," IEEE Transactions on Communication, Aug. 2005, DP-1288-1299, vol. 53, No. 8.

(Continued)

*Primary Examiner* — Joseph D Torres

(57) ABSTRACT

A decoder circuit includes first and second decoders. The first decoder is a first type of decoder configured to receive data encoded with an error correction code and decode and eliminate errors from a first subset of codewords of the data. The second decoder is a second type of decoder configured receive the data encoded with the error correction code and decode and eliminate errors from a second subset of codewords of the data, different from the first subset of the codewords, without attempting to decode and eliminate errors from the first subset of the codewords.

16 Claims, 12 Drawing Sheets

(56) References Cited

U.S. PATENT DOCUMENTS

| | | |
|---|---|---|
| 8,918,694 B2 | 12/2014 | Morero et al. |
| 9,170,876 B1 | 10/2015 | Bates et al. |
| 9,608,666 B1 | 3/2017 | Morero et al. |
| 10,063,262 B2 | 8/2018 | Morero et al. |
| 10,103,751 B2 | 10/2018 | Morero et al. |
| 10,727,874 B2 | 7/2020 | Morero et al. |
| 2003/0140302 A1 | 7/2003 | Litwin et al. |
| 2005/0183092 A1 | 8/2005 | Christensen et al. |
| 2006/0045214 A1* | 3/2006 | Shiina ............... H04L 1/0071 375/341 |
| 2006/0052513 A1 | 3/2006 | Butz et al. |
| 2006/0123318 A1 | 6/2006 | Kim et al. |
| 2006/0156179 A1 | 7/2006 | Shen et al. |
| 2006/0195754 A1 | 8/2006 | Shen et al. |
| 2007/0257826 A1* | 11/2007 | Coene ............... H03M 5/145 341/61 |
| 2008/0148133 A1 | 6/2008 | Duggan |
| 2008/0209305 A1* | 8/2008 | Sato ............... H04L 1/0068 714/790 |
| 2008/0276156 A1 | 11/2008 | Gunnam et al. |
| 2009/0019333 A1 | 1/2009 | McEvoy et al. |
| 2009/0052513 A1 | 2/2009 | Heikkila |
| 2009/0106621 A1 | 4/2009 | Yokokawa |
| 2009/0158127 A1 | 6/2009 | Miyauchi et al. |
| 2010/0042891 A1 | 2/2010 | Gunnam et al. |
| 2010/0042898 A1 | 2/2010 | Gunnam |
| 2010/0042903 A1 | 2/2010 | Gunnam |
| 2010/0042906 A1 | 2/2010 | Gunnam et al. |
| 2010/0169734 A1 | 7/2010 | Gamage et al. |
| 2010/0211846 A1 | 8/2010 | Matsumoto et al. |
| 2010/0241921 A1 | 9/2010 | Gunnam |
| 2010/0275096 A1* | 10/2010 | Zhong ............... H03M 13/6331 714/746 |
| 2010/0281330 A1 | 11/2010 | Blanksby et al. |
| 2011/0029756 A1 | 2/2011 | Biscondi et al. |
| 2011/0087933 A1 | 4/2011 | Varnica et al. |
| 2011/0090734 A1 | 4/2011 | Burger, Jr. et al. |
| 2011/0126078 A1 | 5/2011 | Ueng et al. |
| 2011/0138248 A1 | 6/2011 | Wu et al. |
| 2011/0264979 A1 | 10/2011 | Gunnam et al. |
| 2012/0005551 A1 | 1/2012 | Gunnam |
| 2012/0221914 A1 | 8/2012 | Morero et al. |
| 2012/0240007 A1* | 9/2012 | Barndt ............... H03M 13/3707 714/E11.03 |
| 2013/0007554 A1 | 1/2013 | Chen et al. |
| 2014/0040531 A1* | 2/2014 | Wu ............... G11C 16/26 711/E12.008 |
| 2016/0034354 A1 | 2/2016 | Hashimoto et al. |
| 2018/0253353 A1* | 9/2018 | Takase ............... H03M 13/2906 |
| 2019/0068222 A1 | 2/2019 | Lee |
| 2019/0081641 A1 | 3/2019 | Symons et al. |

OTHER PUBLICATIONS

Johnson, L. "Low Density Parity-Check Codes from Combinatorial Designs," PhD Dissertation, The University of Newcastle, Australia, Apr. 2004, two hundred twenty-three pages.

Morero, D.A. et al., "Parallel Architecture for Decoding LDPC Codes on High Speed Communication Systems," EAMTA 2008, Proceedings of the Argentine School of Micro-Nanoelectronics, Technology and Applications, Sep. eooa, pp. 101-110.

Muller et al., "A Novel LDPC Decoder for DVB-S2 IP," EDM, 2009, six pages.

Song, S. et al., "A Unified Approach to the Construction of Binary and Nonbinary Quasi-Cyclic LDPC Codes Based on Finite Fields," IEEE Transactions on Communications, Jan. 2009, pp. 84-93, vol. 57, No. 1.

PCT International Search Report and Written Opinion, PCT Application No. PCT/US2012/026819, dated Jul. 25, 2012, eleven pages.

Liu, L. et al., "Sliced Message Passing: High Throughput Overlapped Decoding of High-Rate Low-Density Parity-Check Codes," IEEE Transactions on Circuits and Systems—I:Regular Papers, Dec. 2008, pp. 3697-3710, vol. 55, No. 11.

United States Office Action, U.S. Appl. No. 13/406,452, dated Feb. 14, 2014, 18 pages.

United States Office Action, U.S. Appl. No. 14/561,183, dated Apr. 21, 2016, 41 pages.

United States Office Action, U.S. Appl. No. 15/000,978, dated Apr. 5, 2017, 54 pages.

U.S. Appl. No. 16/778,918, filed Jan. 31, 2020, Castrillon et al.

U.S. Appl. No. 17/666,066, filed Feb. 7, 2022, Morero et al.

* cited by examiner

Profile of power consumption as a function of the SNR $$H = \begin{bmatrix} 1 & 1 & 1 & 0 & 1 & 0 & 0 & 0 & 0 \\ 0 & 0 & 0 & 1 & 1 & 1 & 0 & 0 & 0 \\ 0 & 0 & 0 & 0 & 0 & 0 & 1 & 1 & 1 \\ 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \end{bmatrix} \begin{matrix} C_0 \\ C_1 \\ C_2 \\ C_3 \\ C_4 \\ C_5 \end{matrix}$$

(columns labeled $V_0\ V_1\ V_2\ V_3\ V_4\ V_5\ V_6\ V_7\ V_8$)

DECODER CIRCUIT INCLUDING DECODERS WITH RESPECTIVE PERFORMANCE AND POWER LEVELS AND DECODING RESPECTIVE SUBSETS OF CODEWORDS OF RECEIVED DATA

CROSS-REFERENCES TO RELATED APPLICATIONS

The present disclosure is a continuation of U.S. patent application Ser. No. 16/778,918, filed on Jan. 31, 2020. The entire disclosure of the application referenced above is incorporated herein by reference.

The present application incorporates by reference, for all purposes, the following commonly owned U.S. patents: U.S. patent application Ser. No. 15/188,957, titled "NON-CONCATENATED FEC CODES FOR ULTRA-HIGH SPEED OPTICAL TRANSPORT NETWORKS," filed on Jun. 21, 2016, now U.S. Pat. No. 10,103,751; U.S. patent application Ser. No. 15/000,978, titled "NON-CONCATENATED FEC CODES FOR ULTRA-HIGH SPEED OPTICAL TRANSPORT NETWORKS," filed on Jan. 19, 2016, now U.S. Pat. No. 10,063,262; U.S. patent application Ser. No. 14/561,183, titled "NON-CONCATENATED FEC CODES FOR ULTRA-HIGH SPEED OPTICAL TRANSPORT NETWORKS," filed on Dec. 4, 2014, now U.S. Pat. No. 9,608,666; and U.S. patent application Ser. No. 13/406,452, titled "NON-CONCATENATED FEC CODES FOR ULTRA-HIGH SPEED OPTICAL TRANSPORT NETWORKS," filed on Feb. 2, 2012, now U.S. Pat. No. 8,918,694.

BACKGROUND OF THE INVENTION

The present invention generally relates to communication systems and integrated circuit (IC) devices. In particular, the present invention relates to improved methods and devices for energy-efficient decoders and their implementations in communication systems.

State of the art optical transport networks make use of soft-decision decoding codes as a result of the required performance in the current systems. Soft-decision codes provide coding gains of 1 dB or more relative to their hard-decision counterparts. However, this improved performance comes at the expense of a significantly increased decoding complexity. Current soft-decision decoders consume an order of magnitude more power than hard-decision decoders operating at the same overhead (OH) and throughput.

On the other hand, the miniaturization of optical communications guided by optical integration and modules development requires that the components have limited power consumption. In some cases, compliance with the power restriction for each module or application is very tight. The heart of an optical communications device is the digital signal processor (DSP) application-specific integrated circuit (ASIC) and one of the main parts inside of DSP in terms of power consumption is the forward error correction (FEC) implementation. Therefore, having soft-decision decoders with low power consumption is crucial for the next generation communication equipment.

Although there are several types of devices and methods related to decoders, they have been inadequate for the advancement of various applications. Conventional embodiments consume large areas or large amounts of power and suffer from performance limitations. Therefore, improved devices and methods for energy-efficient decoders and related communication systems are highly desired.

BRIEF SUMMARY OF THE INVENTION

The present invention generally relates to communication systems and integrated circuit (IC) devices. More particularly, the present invention relates to improved methods and devices for energy-efficient decoders and their implementations in communication systems.

According to an example, the present invention provides a method and device for energy-efficient decoder configurations. The decoder device can include a plurality of decoder modules coupled in series that are configured to process an input data signal having a plurality of forward error correction (FEC) codewords. This plurality of decoder modules can include at least a first decoder module followed by a second decoder module. In an example, the first decoder module is configured as a low-power decoder and the second decoder module is configured as a high-performance decoder. In this case, the low-power decoder first eliminates the errors of most of the codewords and the high-performance decoder corrects the remaining errors, which requires less power than eliminating all of the errors within a target performance range with the high-performance decoder alone.

In another example, the first decoder module is configured as the high-performance decoder and the second decoder module is configured as the low-power decoder. In this case, the high-performance decoder corrects errors of the codewords to the point at which the low-power decoder can correct the remaining errors. Also, the plurality of decoders can be configured with a classifier module, which can determine portions of the plurality of codewords to be directed to different decoder modules of the plurality of decoder modules. These examples can be extended to include additional decoders using different decoding algorithms at different levels of performance and power consumption. Further, inactive decoder modules can be kept in a sleep-state while an active decoder module is processing the FEC codewords to reduce power consumption.

According to an example of the present invention, the decoder device can include a plurality of decoder modules configured as a fully-connected finite state machine (FSM). Each of the plurality of decoder modules can be associated with a state of the FSM and be associated with a decoding algorithm from a predetermined set of decoding algorithms. Each state of the FSM can have a plurality of transition conditions. The plurality of decoder modules can be configured to receive the input data signal having a plurality of FEC codewords, and to process the plurality of FEC codewords at an initial state of the FSM configured to perform a first decoding iteration according to the associated decoding algorithm of the initial state. The plurality of decoder module can also be configured to iteratively provide the plurality of FEC codewords to subsequent transition states of the FSM according to the plurality of transition conditions of the initial state and the plurality of transition conditions of each of the subsequent transition states, and to iteratively process the plurality of FEC codewords at each of the subsequent transition states according to the associated decoding algorithm of each of the subsequent transition states.

In a specific example, the plurality of transition conditions of the states of the FSM can be configured to maximize the chances of success under restrictions of a maximum number of iterations (i.e., steps between states) and a maximum power dissipation. The predetermined set of decoding algorithms can be an ordered set of algorithms that is ordered by level of complexity and performance. Also, the plurality of decoder modules can be configured to process the plurality of FEC codewords using a transition probability stochastic matrix to minimize a cost function based on a predetermined maximum number of iterations and a predetermined target performance.

Examples of present invention achieve many benefits, such as greater energy efficiency while without sacrificing decoding performance. A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention the presently described embodiments and the presently understood best mode of the invention are described with additional detail through the use of the accompanying drawings in which.

DETAILED DESCRIPTION OF THE INVENTION

Figure 1A:
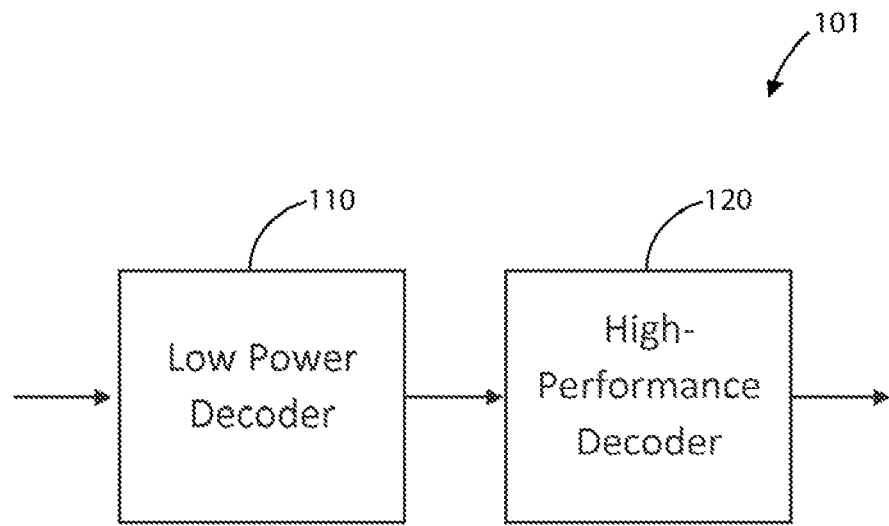
FIGS. 1A to 1C are simplified block diagrams illustrating decoder devices according to various examples of the present invention.

The present invention generally relates to communication systems and integrated circuit (IC) devices. More particularly, the present invention relates to improved methods and devices for energy-efficient decoders and their implementations in communication systems.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

According to various examples, the present invention provides methods and structures for energy-efficient decoders and related forward error correction (FEC) implementations. In an example, an apparatus is proposed to lower power consumption in iterative decoder schemes. This apparatus uses a technique that is applied to soft-decision decoders based on low-density parity-check (LDPC) codes but can also be used with any other error correction code (ECC), such as Turbo Codes, Polar Codes, BCH/RS Codes, Braided Codes, and the like. The apparatus comprises a plurality of decoders that work in a specific order and conditioned to the result of the previous decoders.

In its simplest approach, the apparatus involves a low power consumption decoder with a low word error rate (WER) configured at the operation point which generally cannot achieve the target performance followed by a more complex (i.e., high-performance) decoder that is able to achieve the expected performance. In this example, the received data is first processed by a low power decoder, if this decoder cannot correct the errors in the received data, this data is then processed by a high-performance decoder at the expense of more power, otherwise this second decoder remains in sleep state. Because the low-power decoder corrects most of the codewords only a very small set is decoded by the high-performance decoder.

Note that the use or concatenation of several decoders as here proposed does not imply the use of "concatenated codes"; rather the idea is that several decoders algorithms operate over the same code. On the contrary, the classical concatenated codes scheme makes use of decoders that operate over different codewords and that interchange information between them in a scheme that is usually known as Turbo Codes.

For the present invention, the idea to produce decoders with very low power consumption is accomplished by taking advantage of the fact that a high percentage (>90%) the received data does not require a high-performance decoder to eliminate the errors of the data. In addition, examples of the present invention take advantage that a low-power decoder can be implemented using suboptimal algorithms with low switching activity, which is the main contributor to the power dissipation.

Figure 1B:
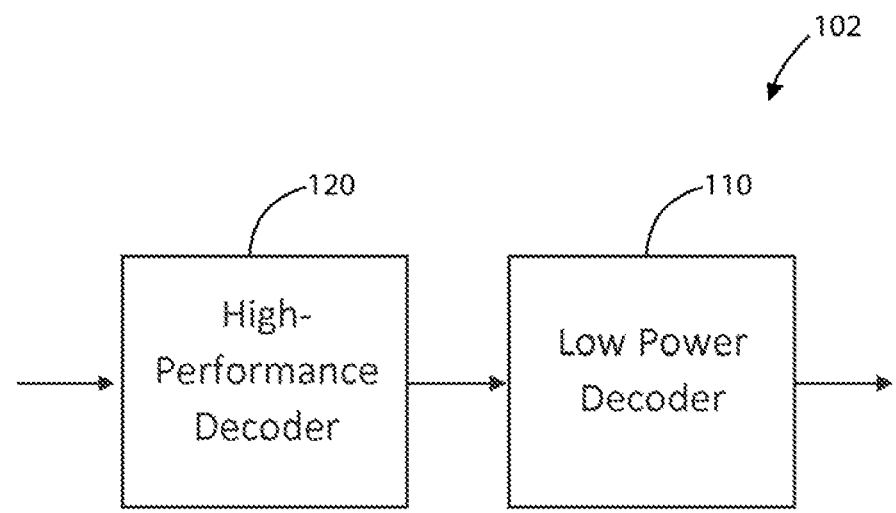
Figure 1C:
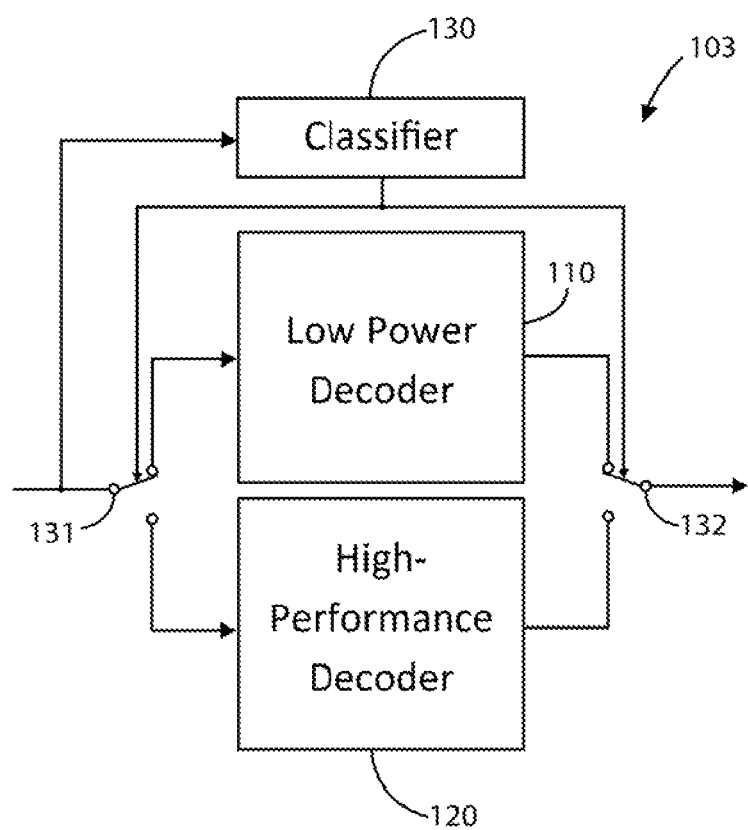

FIGS. 1A to 1C are simplified block diagrams illustrating different topologies of decoder devices involving this gross classification between two types of decoders (i.e., low-power and high-performance). FIG. 1A shows a device 101 with a low-power decoder module 110 followed by a high-performance decoder module 120. As discussed previously, the low-power decoder module 110 eliminates the errors of most of the received codewords (>90%) but it cannot achieve the target performance (e.g., WER<1e-15). The portion of the received data that cannot be processed adequately by the low-power decoder module 110 is then processed by the high-performance decoder module 120 to reach the target performance.

Alternatively, FIG. 1B shows a device 102 that is in a reversed configuration compared to device 101 where the high-performance decoder module 120 is followed by the low-power decoder module 110. In this case, the high-performance decoder module 120 processes a portion of received data to reduce the number of errors into a range in which the low-power decoder module 110 can process the remaining received data. The implementations shown in FIGS. 1A and 1B can be expanded to include more than two decoder modules connected in series that use different decoding algorithms and have varying levels of performance and power consumption.

FIG. 1C shows device 103 with a different configuration in which both the low-power decoder module 110 and the high-performance decoder module 120 are configured with a classifier module 130. As shown, the classifier 130 receives the incoming data signal and controls a first switch 131 and a second switch 132. The first switch 131 controls the input path to the low-power decoder 110 and the high-performance decoder 120 while the second switch 132 controls the output path from these decoders 110, 120. In this configuration, the classifier 130 can direct the incoming data signal (or portions of the incoming data) through the low-power decoder 110 or the high-performance decoder 120 depending on positions of the switches 131, 132. In a specific example, the classifier 130 evaluates the incoming data signal to determine a plurality of portions of the received codewords and directs a portion of the codewords to the low-power decoder 110 and another portion of the codewords to the high-performance decoder 130. The classifier can determine which portion of the codewords goes to which decoder module based on pre-FEC bit error rate (BER) metrics, mutual information metrics, or the like. This implementation can be expanded to include more than two decoder modules using different decoding algorithms and having varying levels of performance and power consumption.

The topologies shown in FIGS. 1A to 1C are only particular examples of the present invention, and those of ordinary skill in the art will recognize other variations, modifications, and alternatives. Further details regarding the implementation of these decoder topologies are discussed below, including a generalization of the power reduction concept involving a plurality of different algorithms or decoders.

Figure 2:
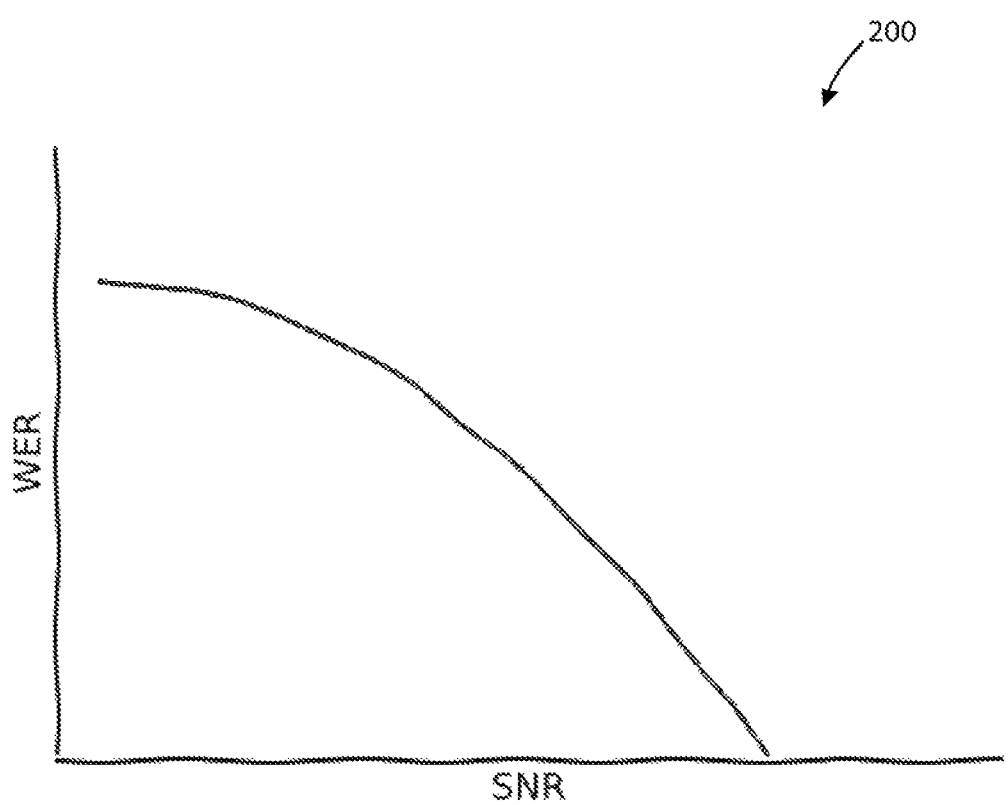
FIG. 2 is a simplified logarithmic scaled graph of word error rate (WER) versus signal-to-noise ratio (SNR) of a decoder device according to an example of the present invention.

In the context of the decoder implementations, the parameter that determines the rate of decoding for each decoder is the word error rate (WER). FIG. 2 is a simplified logarithmic scaled graph of WER versus signal-to-noise ratio (SNR) of a decoder device according to an example of the present invention. This graph 200 shows that as the SNR increases, the WER decreases. If the WER of the first decoder ($WER_{first}$) at the operation point is 0.01, then only a 1% of the incoming codewords are processed by the second decoder. Thus, the total power consumption is represented by $P_{total} = P_{first} + WER_{first} \times P_{second}$, where $P_{first}$ is the power consumption of the first decoder and $P_{second}$ is the power consumption of the second decoder assuming that all received data is processed in both decoders.

In order to provide a way to specify when a codeword is successfully decoded a satisfied party check equation is used. If the parity check equation is not sufficiently robust, a cyclic redundancy check (CRC) can be added to provide more robustness.

An example implementation of the high-performance decoder can include details in U.S. Pat. No. 10,103,751, titled "Non-concatenated FEC Codes for Ultra-high Speed Optical Transport Networks", which is incorporated by reference. In an example, the high-performance decoder can be a soft decision decoder, such as a soft-input soft-output (SISO) decoder, or a soft-input hard-output (SIHO) decoder, or the like. Certain details of an example implementation of the high-performance decoder are also discussed below in reference to FIGS. 9 to 11.

In an example, the low power decoder (in the case of LDPC) can be based on soft bit-flipping algorithm. This algorithm provides low power consumption since the messsage on going in the graph are hard bits and soft information is only stored in the variable nodes. In an example, the low-power decoder can be a hard decision decoder, such as a hard-input hard-output (HIHO) decoder, or a SIHO decoder, or the like. In a specific example, the low-power decoder can be implemented a modified version of the high-performance decoder where the resolution of the messages has been reduced to one bit. The error floor frequently present in this kind of decoder is not an issue in this invention because in the concatenated scheme the other decoder (i.e., the high-performance decoder) eliminates any undesirable error floor problem.

Figure 3:
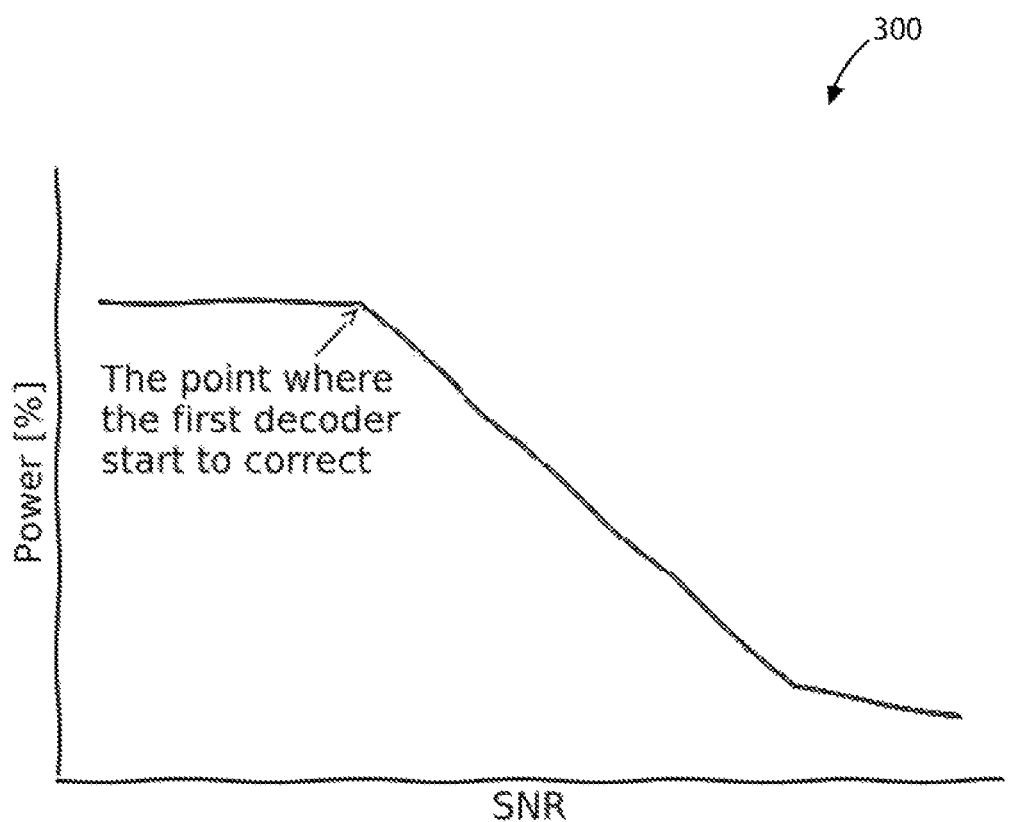
FIG. 3 is a simplified graph representing a power consumption profile over SNR of a decoder device according to an example of the present invention.

FIG. 3 is a simplified graph representing a power consumption profile over SNR of a decoder device according to an example of the present invention. If both decoders support the maximum throughput, the scheme can operate in the same range of SNR as that of the high-performance decoder alone without any degradation, but with the advantage that as the SNR increases the power decreases relative to the WER. As shown in graph 300, this behavior presents a profile of power consumption that drops abruptly with the increase of the SNR once the threshold of the code is reached (marked as the point where the first decoder starts to correct). Another option is to implement a reduced throughput version for the second decoder in order to reduce complexity of the overall scheme, but in that example the performance of the system is mainly settled by the performance of the first decoder. This is because the second decoder can only process a reduced fraction ρ of the received codewords (e.g., ρ=0.1), then this scheme only works if the WER of the first decoder is lower than ρ.

As discussed for device 102 of FIG. 1B, the decoders can be combined in the reverse order, i.e., the high-performance decoder followed by the low-power decoder. This scheme is more suitable for turbo product codes, in which, for example, the first stage can use a soft-decision decoder and the last stage can use a hard-decision decoder. In this scheme, a high-performance decoder brings the performance into a range where a second hard decision decoder can operate and improve the performance. In this way, the power of the last stage is reduced by employing a less consuming hard-decision decoder and the performance remains almost the same as if all the processing had been done with the soft-decision decoder.

The present invention expands on such techniques by providing methods and devices using a plurality of combinations between different decoder algorithms each one corresponding to a particular performance and power profile to get an energy efficient overall system. Depending on the types of combined decoders, the scheme might have a different topology.

The most powerful codes to date are based on iterative soft decision decoding. These codes are commonly known as modern codes. The concept of modern codes refers to codes based on iterative decision decoding, particularly turbo product codes (TPC) and low-density parity-check (LDPC) codes. But these types of codes can be considered as a part of the same family of codes on graph called generalized LDPC (GLDPC).

Figures 4A, 4B:
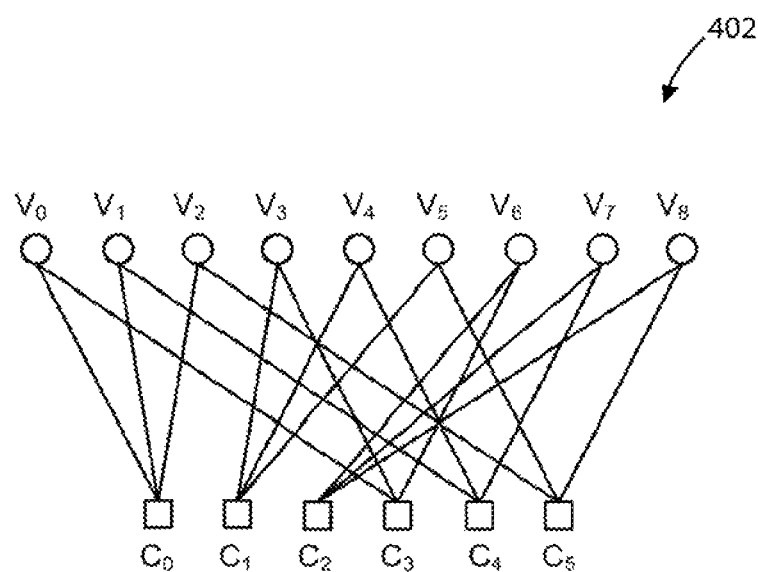
FIGS. 4A and 4B represent a parity check matrix and a Tanner graph, respectively, for forward error correction (FEC) according an example of the present invention.

An LDPC code $\mathbb{C}$ is a linear block code defined by a sparse (m×n) parity check matrix H, n represents the number of bits in the block and m denotes the number of parity checks $\mathbb{C}=\{c \in \mathbb{Z}_2^n : Hc=0\}$. The matrix is considered "sparse" because the number of 1s is small compared to the number of 0s. Matrix H can be graphically represented using a Tanner graph (TG). FIG. 4A shows matrix 401, which represents parity check matrix H, and FIG. 4B shows the associated TG 402 for matrix 401. As shown, TG 402 is a bipartite graph composed of two types of nodes: the variable bit $v_i$ nodes (representing the columns of H) and the check $c_i$ nodes (representing the rows of H). A connection between nodes $v_i$ and $c_j$ exists if $H_{j,i}=1$. Note that there are no connections between two check nodes or between two bit nodes.

Typically, LDPC codes are iteratively decoded using simplified version of the sum product algorithm (SPA) such as the Min-Sum Algorithm (MSA), the Scaled MSA (SMSA), and the Offset MSA (OMSA). Those of ordinary skill in the art will recognize the application of the present invention using other variations, modifications, and alternatives to these decoding algorithms.

In an example, the present invention uses the SMSA, which provides a good tradeoff between performance and complexity. Let $b_i$ and $x_i$ be the i-th coded bit and the corresponding channel output, respectively. The input to the SPA decoder is the prior log-likelihood ratio (LLR) defined by $$L_i^a = \ln\left(\frac{Pr\{b_i = 0 | x_i\}}{Pr\{b_i = 1 | x_i\}}\right).$$

The SPA runs over the factor graph interchanging soft information between bit and check nodes. Each iteration consists of two steps. In the first step all the bit nodes send information to the check nodes. In the second step all the check nodes send information to the bit nodes. After a maximum number of iterations $I_{max}$ is reached or when all the parity check equations are satisfied, the a posteriori LLR ($L_k^o$) is computed.

Figure 5:
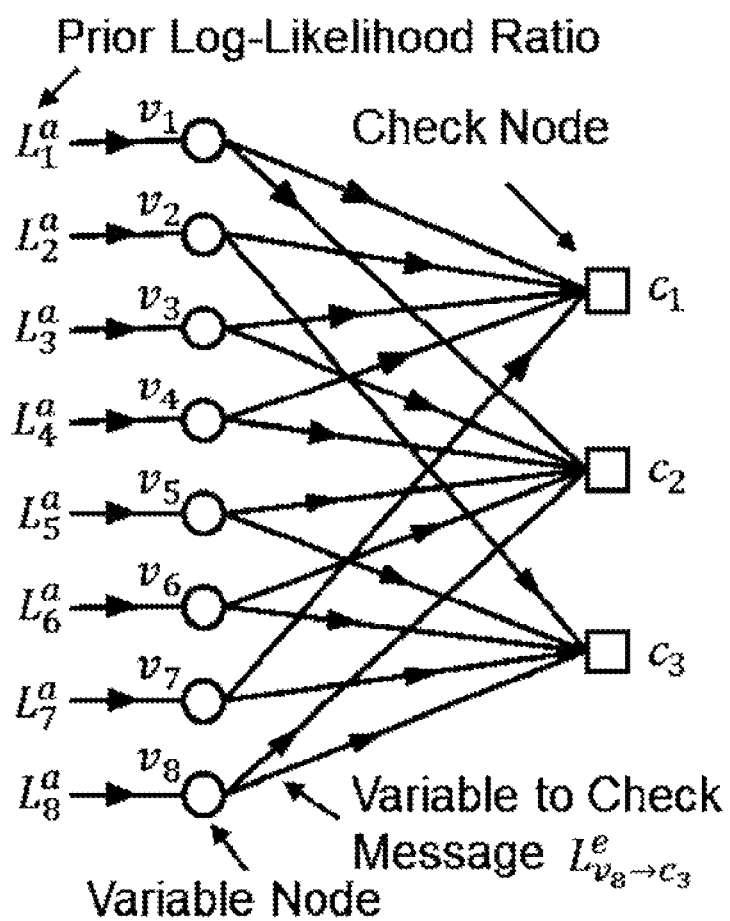
FIG. 5 is a Tanner graph (TG) representation of a bit-to-check message operation of a decoder device according to an example of the present invention.

FIG. 5 is a TG representation of a bit-to-check message (a.k.a. variable-to-check message) operation of a decoder device according to an example of the present invention. As shown, TG 500 shows eight variable bit nodes (denoted $v_1$ to $v_8$) and three check nodes (denoted $c_1$ to $c_3$). As the decoder receives the prior LLR inputs (denoted $L_1^\alpha$ to $L_8^\alpha$), the variable bit nodes send information to the check nodes. This bit-to-check operation can be represented as follows:

$$L_{v_i \to c_j}^e = L_i^a + \sum_{c_k \in C^{(v_i)} \setminus c_j} L_{c_k \to v_i}^e$$

where $C^{(v_i)}=\{c_j : H_{j,i} \neq 0\}$.

Figure 6:
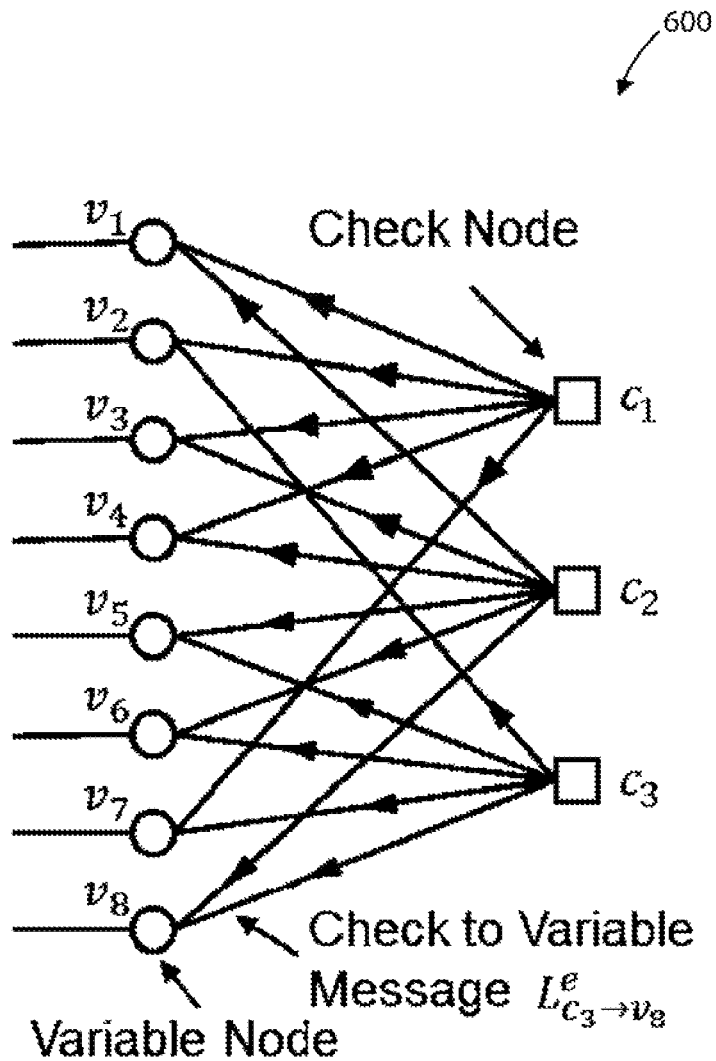
FIG. 6 is a TG representation of a check-to-bit message operation of a decoder device according to an example of the present invention.

FIG. 6 is a TG representation of a check-to-bit message operation of a decoder device according to an example of the present invention. In the same format as FIG. 5, TG 600 shows eight variable bit nodes (denoted $v_1$ to $v_8$) and three check nodes (denoted $c_1$ to $c_3$). Following the bit-to-check operation, the check nodes send information back to the variable bit nodes. This check-to-bit operation can be represented as follows:

$$L_{c_j \to v_i}^e = \prod_{v_k \in V^{(c_j)} \setminus v_i} \text{sign}\left(L_{v_k \to c_j}^e\right) \cdot M_{c_j \to v_i}$$

$$M_{c_j \to v_i} = \alpha \cdot \min_{v_k \in V^{(c_j)} \setminus v_i} \left| L_{v_k \to c_j}^e \right|$$

where $V^{(c_j)}=\{v_i : H_{j,i} \neq 0\}$ and $\alpha \approx 0.75$

In this example, the check-to-bit message calculation corresponds to the SMSA, but the same concept also applies to TPCs only that the calculation of the message in this case may involve algorithms such as the Chase-Pyndiah decoding algorithm. Of course, there can be other variations, modifications, and alternatives.

Figure 7:
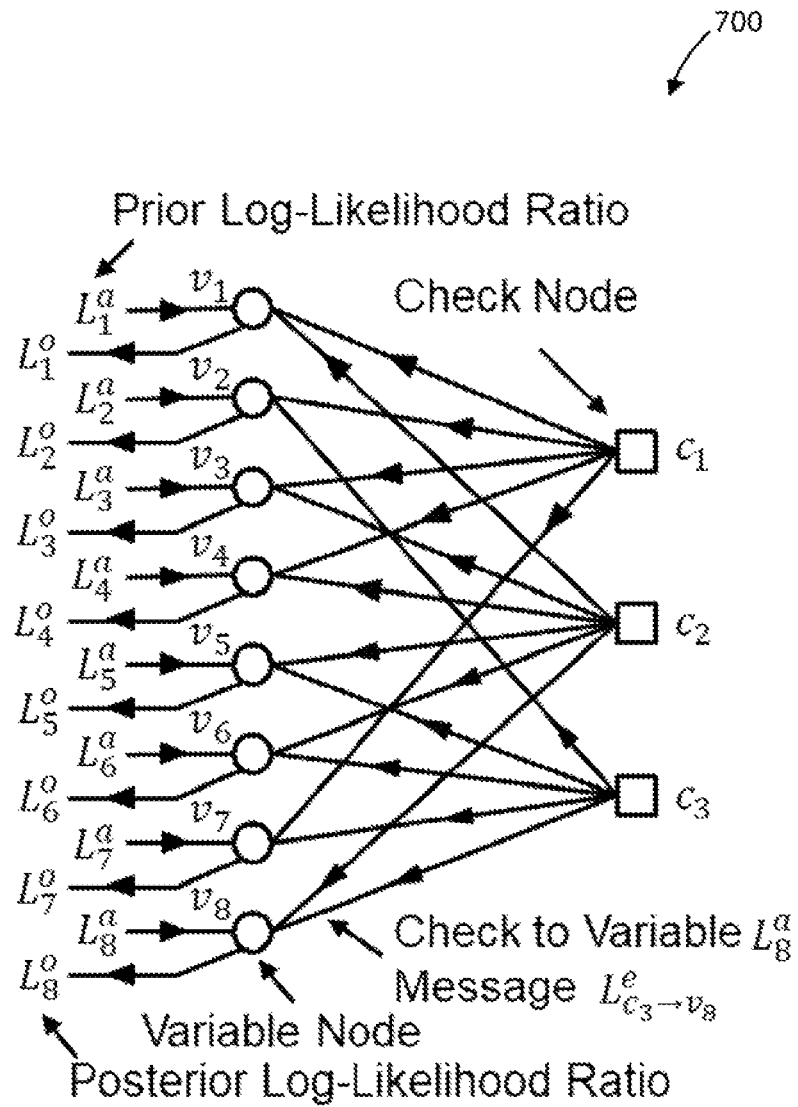
FIG. 7 is a TG representation of a computation of the a posteriori log-likelihood ratio (LLR) for a decoder device according to an example of the present invention.

FIG. 7 is a TG representation of a computation of the a posteriori LLR for a decoder device according to an example of the present invention. In the same format as FIGS. 5 and 6, TG 700 shows eight variable bit nodes (denoted $v_1$ to $v_8$) and three check nodes (denoted $c_1$ to $c_3$). As discussed previously, after N iterations, the a posteriori LLR is calculated. This operation can be represented as follows:

$$L_i^o = L_i^a + \sum_{c_k \in C^{(v_i)}} L_{c_k \to v_i}^e$$

FIGS. 5 to 7 show an example of a method of operating a decoder using an SMSA. Those of ordinary skill in the art will recognize variations, modifications, and alternatives involving other versions of the SPA, or other related algorithms. Expanding upon the methods and devices discussed previously, the present invention provides for an iterative decoding algorithm that uses a plurality of different algorithms or types of decoders to minimize power consumption. An example of such a method and device architecture are discussed below.

In an example, the iterative decoding process can be decomposed in the successive application of a set of algorithms $\mathcal{A} = \{A_1, A_2, \ldots, A_S\}$ in which each algorithm can be used independently in each iteration. This system can be considered as a finite state machine (FSM) in which each state corresponds to an algorithm. In an example, each state can also correspond to a decoder module configured to implement a specific decoding algorithm in the set $\mathcal{A}$. The state machine is fully connected, i.e., any state is reachable for any other state in one step. In a specific example, the set $\mathcal{A}$ can include algorithms sorted by level of complexity and performance. As discussed previously, such algorithms can include variations of MSA, OMSA, SMSA, soft bit-flipping, and the like. The variations of these algorithms can be generated by varying the resolution of them messages or by using other like processes.

Figure 8:
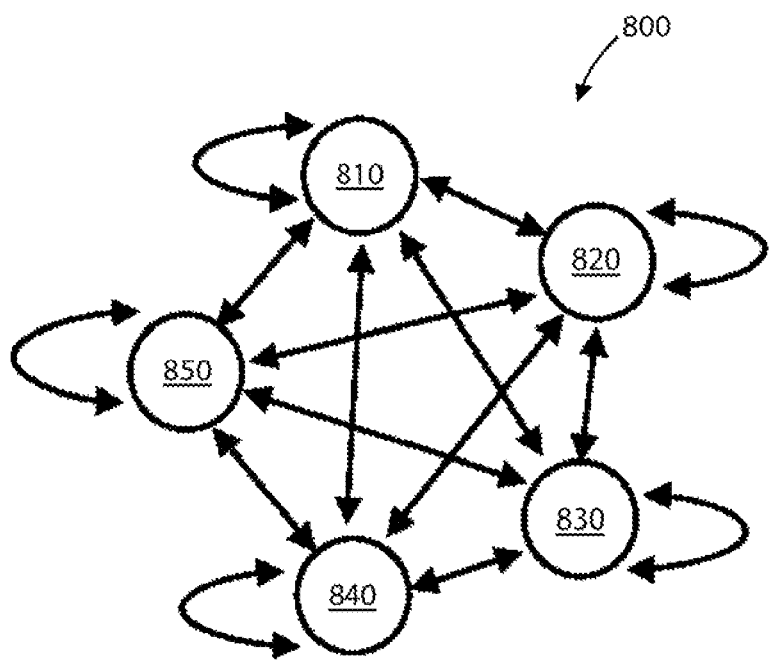
FIG. 8 is a simplified finite state machine diagram illustrating a method of optimizing use of decoder algorithms in a decoder device according to an example of the present invention.

FIG. 8 is a simplified FSM diagram illustrating a method of optimizing use of decoder algorithms in a decoder device according to an example of the present invention. In this example, FSM 800 includes five states (denoted 810 to 850), each representing a decoder algorithm in the set or a decoder module configured to perform the decoding algorithm in the set. As discussed, the operation arrows show that each state is fully connected. In other examples, the decoder device can be configured to implement a plurality of decoder algorithms or a plurality of decoder modules, each configured to implement such decoder algorithms.

There can be several conditions to transition from one state to another. For example, a transition condition can occur when a certain algorithm provides no further improvement with further iterations. Because time is limited, only a fixed total number of steps is allowed. With this consideration, the maximum number of steps for each algorithm must be determined to obtain a global optimal in terms of power and performance. Of course, the best performance can be reached by always using the best performing algorithm, but this approach would also be costly in terms of power. Instead, examples of the present invention constrain the best performance to a given power (or, equivalently, minimize power subject to a given performance). In other words, the present invention provides for a method of optimization and device implementation to maximize the decoder performance subject to a given maximum power constraint.

In an example, the flow of information between steps allows $L_i^0 = L_i^\alpha + \alpha L_i^e$ where $0 \leq \alpha \leq 1$. When $\alpha = 0$, this is an indication of a restart of the system with the a priori information, i.e., $L_i^0 = L_i^\alpha$.

The number of algorithms and the type of interchanging information can be variable depending on the code involved. The number of steps or iterations in general also depends on the decoder and the type of code.

In the following example, the present invention provides a criterion for power optimization based on transition probability (stochastic) matrix. If the probability of moving from i to j in one-time step or iteration at the $n^{th}$ iteration is $\Pr(j|i) = P_{i,j}[n]$, then the stochastic matrix $P[n]$ is given by using $P_{i,j}[n]$ as the $i^{th}$ row and $j^{th}$ column element, as follows:

$$P[n] = \begin{bmatrix} P_{1,1}[n] & P_{1,2}[n] & \cdots & P_{1,j}[n] & \cdots & P_{1,S}[n] \\ P_{2,1}[n] & P_{2,2}[n] & \cdots & P_{2,j}[n] & \cdots & P_{2,S}[n] \\ \vdots & \vdots & \ddots & \vdots & \ddots & \vdots \\ P_{i,1}[n] & P_{i,2}[n] & \cdots & P_{i,j}[n] & \cdots & P_{i,S}[n] \\ \vdots & \vdots & \ddots & \vdots & \ddots & \vdots \\ P_{S,1}[n] & P_{S,2}[n] & \cdots & P_{S,j}[n] & \cdots & P_{S,S}[n] \end{bmatrix}$$

where S is the number of available algorithms in the set used for the iterative decoding process.

From this matrix we propose calculate the average power for the entire system as:

$$p_{av} = \sum_{\ell=1}^{I_{max}} p_{it}[\ell] \cdot \left( \prod_{n=1}^{\ell} P[n] \right) \cdot s$$

where s is a vector that represents the initial state of the stochastic state machines, i.e., $s = [1\ 0\ \ldots\ 0]^T$, and $p_{it}[\ell]$ represents the power consumed in each state as a function of the iteration $\ell$. This vector also includes the power of the idle state, the state in which the decoder does nothing because it has already reached the desired target, but the maximum number of allowed iterations ($I_{max}$) has not been reached. Each state consumes a specific amount of power per iteration, so from the inner product between the state vector s with the probability of each state for each iteration P[n] and the vector with the power per each state, the average power $p_{av}$ for the whole system can be obtained.

Note the term ($\prod_{n=1}^{\ell} P[n]$)·s in the equation of $p_{av}$ represents the probabilities of the state vector in the intermediate steps or iterations.

Thus, $p_{av}$ is the cost function to optimize given the desired performance and the maximum number of iterations $I_{max}$. In an example, the values from P[n] and $p_{it}[\ell]$ can be obtained by simulation. Of course, there can be other variations, modifications, and alternatives.

According to an example, the present invention provides a method and device for an energy-efficient decoder configuration. The decoder device can include a plurality of decoder modules configured as a fully-connected FSM. Each of the plurality of decoder modules can be associated with a state of the FSM and be associated with a decoding algorithm from a predetermined set of decoding algorithms. Each state of the FSM can have a plurality of transition conditions. The plurality of decoder modules can be configured to receive an input data signal having a plurality of FEC codewords, and to process the plurality of FEC codewords at an initial state of the FSM configured to perform a first decoding iteration according to the associated decoding algorithm of the initial state. The plurality of decoder modules can also be configured to iteratively provide the plurality of FEC codewords to subsequent transition states of the FSM according to the plurality of transition conditions of the initial state and the plurality of transition conditions of each of the subsequent transition states, and to iteratively process the plurality of FEC codewords at each of the subsequent transition states according to the associated decoding algorithm of each of the subsequent transition states.

In a specific example, the plurality of transition conditions of each state of the FSM is based on different internal metrics of the decoder module associated with that state of the FSM. These metrics can be based on the number of unsatisfied parity check equations, the number of flipped bits of a decoder module associated with a previous state of the FSM, or the like and combinations thereof. The conditions based on such metrics can be determined by certain threshold values, certain ranges, or combinations thereof. In a specific example, the plurality of transition conditions of the states of the FSM can be configured to maximize the chances of successfully decoding the plurality of FEC codewords under restrictions of a maximum number of iterations (i.e., steps between states) and a maximum power dissipation. Such optimization can use factors such as the time available to decode and the speed of transmission. The maximization can be done with discrete optimization algorithms, such as a branch and bound algorithm, or the like.

In a specific example, the predetermined set of decoding algorithms can be an ordered set of algorithms that is ordered by level of complexity and performance. This set can include variations of algorithms previously discussed, such as OMSA, SMSA, soft bit-flipping algorithms, and the like. The variations of these algorithms can be generated by varying the message resolution or by other similar methods. In a specific example, the plurality of decoder modules can be configured to process the plurality of FEC codewords using a transition probability stochastic matrix to minimize a cost function based on a predetermined maximum number of iterations and a predetermined target performance. Further, the plurality of decoders can be configured to iteratively process the plurality of FEC codewords such that while a decoder module associated with a state of the FSM is processing the plurality of FEC codewords, the rest of the plurality of decoder modules associated with the rest of the states of the FSM remain in a sleep-state.

According to an example, the present invention provides a decoder device having a plurality of decoder modules coupled in series. The decoder device is configured to receive an input data signal having a plurality of FEC codewords. The plurality of decoder modules can include i decoder modules, where i is an integer greater than one. These decoder modules can be configured with different WERs by using different decoder architectures and different decoding algorithms.

For example, a first decoder module can be configured to process all incoming codewords in the input data signal. A second decoder module can then be configured to process all of the codewords that the first decoder is not capable of processing. Then, a third decoder module can be configured to process all of the codewords that the first and second decoder are not capable of processing. The input data signal can be processed in succession by further decoder modules up to an i-th decoder module, which can be configured to process all of the codewords that the previous decoder modules were not capable of correcting. In this case, the WER of each subsequent decoder module can be less than the previous decoder module (i.e., first WER>second WER>third WER> . . . >i-th WER). This example can be considered an extension of the implementation shown in FIG. 1A.

Alternatively, the WER of each subsequent decoder module can be greater than the previous decoder module (i.e., first WER<second WER<third WER< . . . <i-th WER). This example can be considered an extension of the implementation shown in FIG. 1B. In this case, each prior decoder module brings the performance into a range that the subsequent decoder module can operate and improve the performance. In this way, the power of each subsequent decoder module can be reduced compared to processing all of the FEC codewords using the highest performance decoder module.

In an example, the decoder device can also include a codeword classifier module, as shown previously in FIG. 1C. The classifier module can process the input data signal to determine a plurality of portions within the plurality of FEC codewords. In this case, the classifier module can be configured to direct certain portions of the FEC codewords to different decoder modules. For example, the first decoder module can be configured to process a first portion of the plurality of FEC codewords, the second decoder module can be configured to process a second portion of the plurality of FEC codewords, and the third decoder module can be configured to process a third portion of the plurality of FEC codewords. Each subsequent decoder module can be configured to process a subsequent portion of the plurality of FEC codewords, up to the i-th decoder module, which would be configured to process the i-th portion of the plurality of FEC codewords. In various examples, the classifier module can be configured to implement the FSM or the probability stochastic matrix discussed previously or other optimization algorithms. Of course, there can be variations, modifications, and alternatives.

Figure 9:
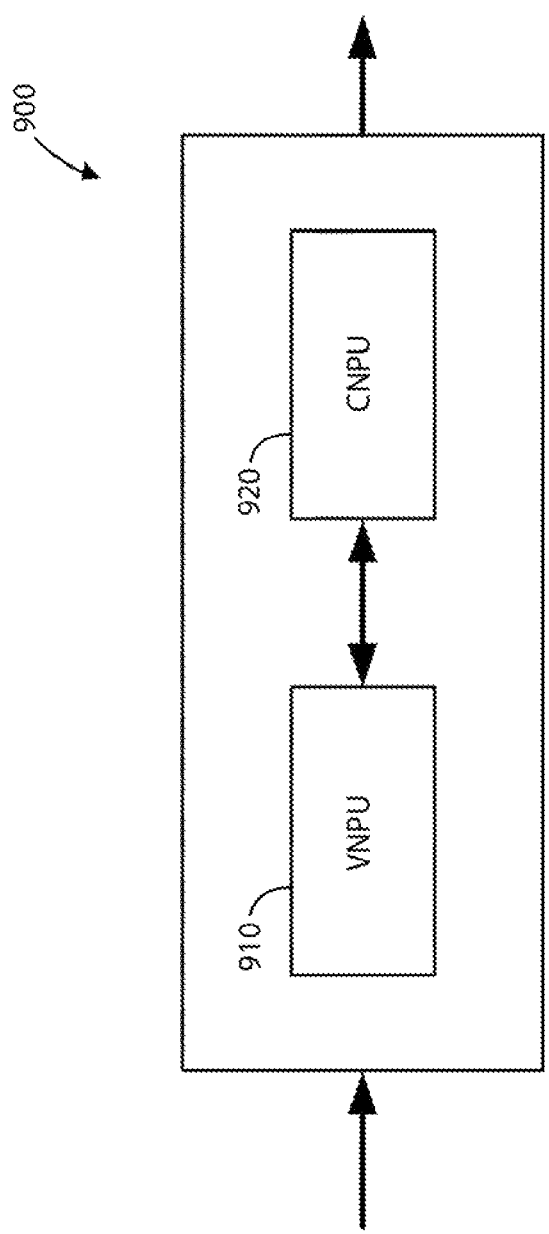
FIG. 9 is a simplified block diagram of a decoder device according to an example of the present invention.

FIG. 9 is a simplified block diagram of a decoder device according to an example of the present invention. As shown, decoder 900 can include a variable-node processing unit (VNPU) 910 and a check-node processing unit (CNPU) 920. The VNPU 910 and/or the CNPU 920 may each comprise a plurality of parallel processing units (e.g., q processing units). The VNPU 910 can be configured to compute the variable-to-check (i.e., bit-to-check) message, as discussed previously for FIG. 5. The CNPU can be configured to compute the check-to-variable (i.e., check-to-bit) message, as discussed previously for FIG. 6. This configuration allows for an efficient parallel decoding process. More specific details of an example CNPU and decoder architecture are provided in reference to FIGS. 10 and 11, respectively.

Figure 10:
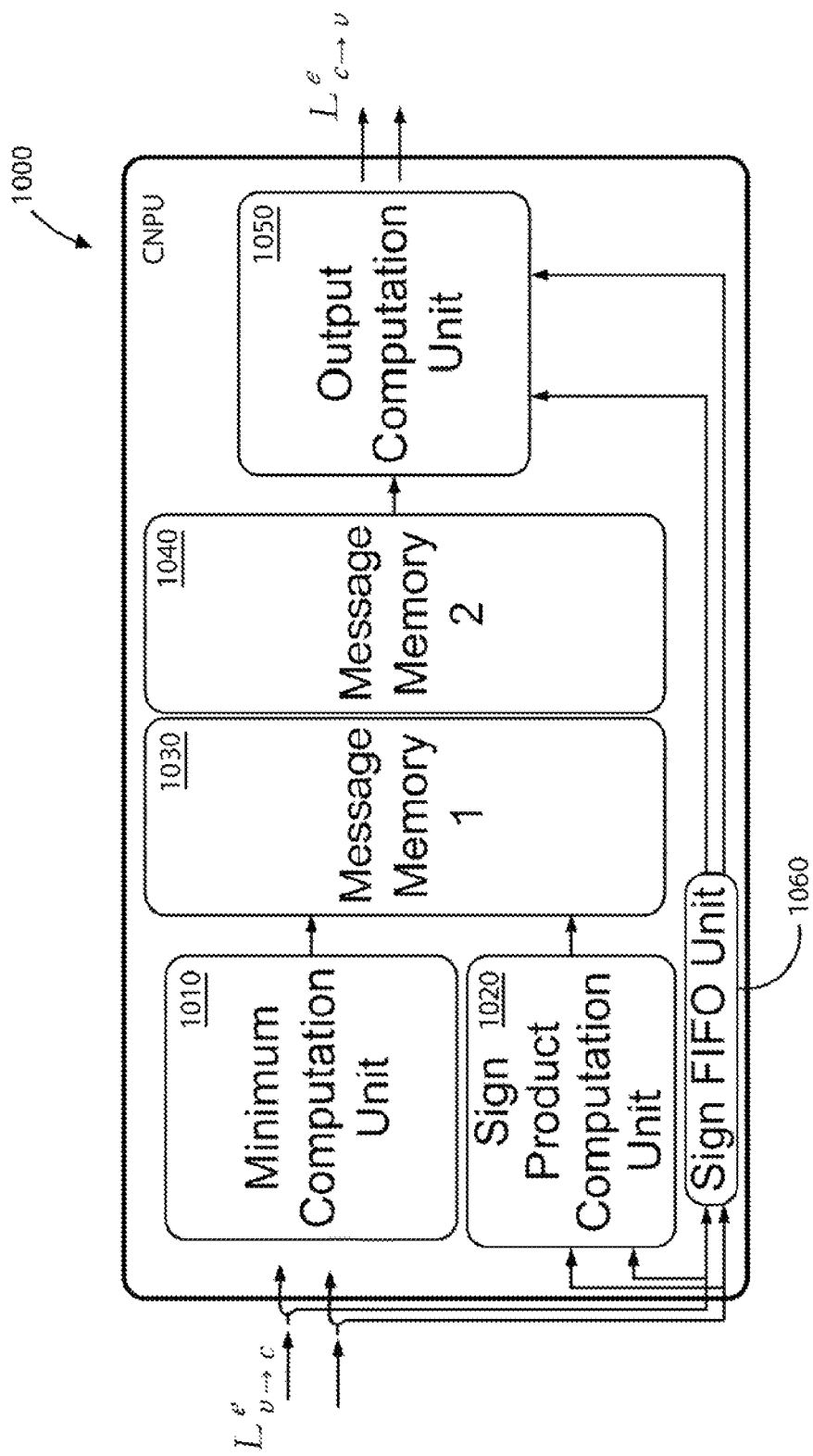
FIG. 10 is a simplified block diagram of a check-node processing unit (CNPU) according to an example of the present invention.

FIG. 10 is a simplified block diagram of a CNPU for processing two codewords at the same time according to an example of the present invention. As shown, CNPU 1000 includes a minimum computation unit 1010, a sign product computation unit 1020, a first message memory 1030, a second message memory 1040, an output computation unit 1050, and a sign first-in first-out (FIFO) unit 1060. The minimum computation unit 1010 and the sign product computation unit 1020 are both coupled to the first message memory 1030. The first message memory is coupled to the second message memory 1040, which is coupled to an output computation unit 1050. The sign FIFO unit 1060 is also coupled to the output computation unit. These units are configured together to compute the check-to-variable message, as discussed for FIG. 6.

In a specific example, each of the minimum computation unit 1010, the sign product computation unit 1020, and the sign FIFO unit 1060 takes the variable-to-check message $$L^e_{v_k \to c_j}$$

from the VNPU as an input. The minimum computation unit 1010 computes the minimum value $$\min_{v_k \in V(c_j) \setminus v_i} |L^e_{v_k \to c_j}|$$

and the sign product computation unit 1020 computes the sign value $$\prod_{v_k \in V(c_j) \setminus v_i} \operatorname{sign}(L^e_{v_k \to c_j}).$$

The first and second message memories 1030, 1040, which are pipelined, store the results of these equations to be used by the output computation unit 1050. The sign FIFO unit

1060 stores the signs of the input variable-to-check messages, which the output computation unit 1050 combines with the values stored in the message memories 1030, 1040 to compute $L_{c_j \to v_i}^e$. With this configuration, the minimum computation unit 1110 and the sign product computation unit 1120 can operate on one codeword while the output computation unit 1050 operates on another codeword because of the two message memories 1030, 1040. Those of ordinary skill in the art will recognize other variations, modifications, and alternatives.

Figure 11:
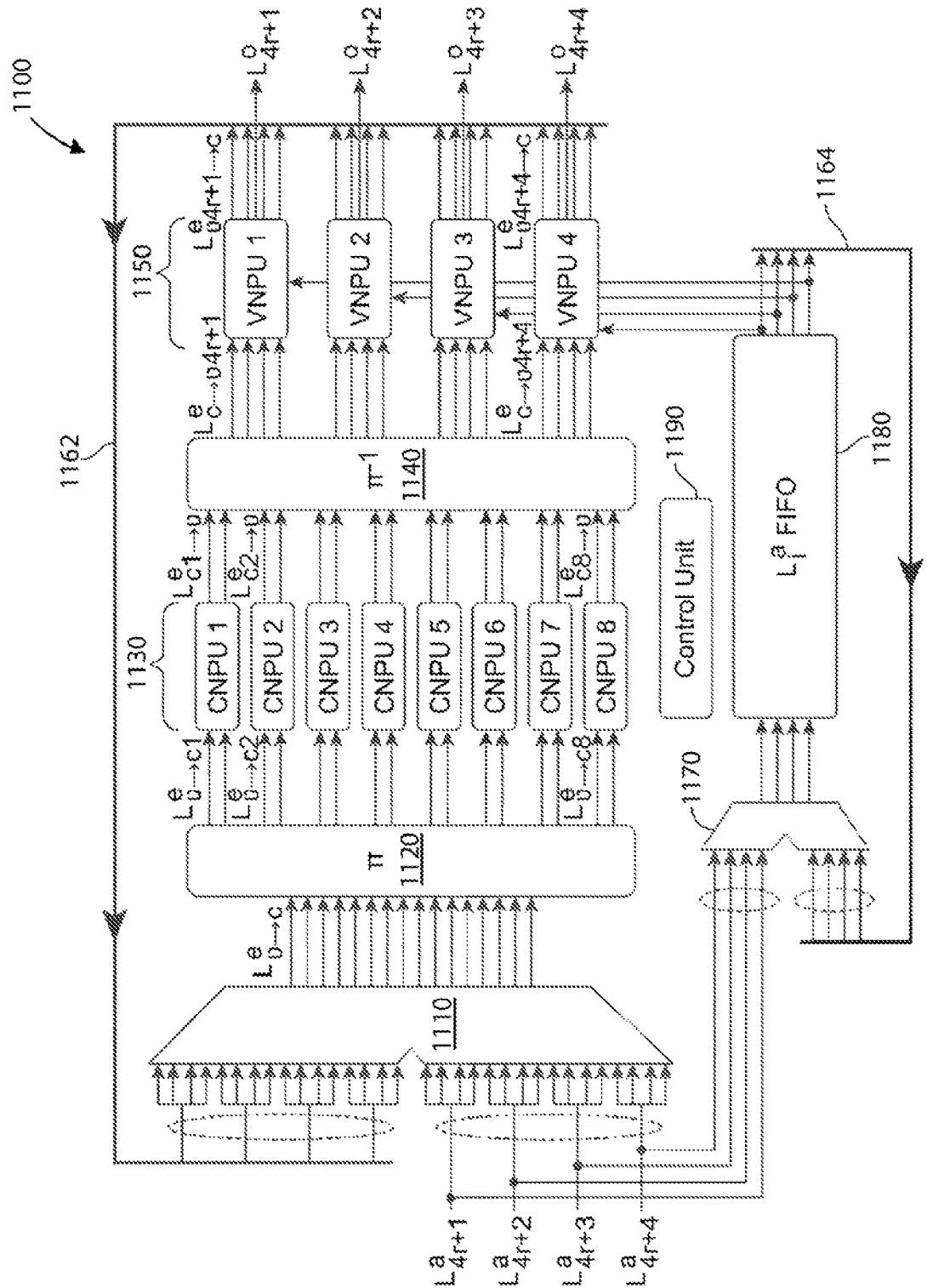
FIG. 11 is a simplified block diagram of a decoder device according to an example of the present invention.

FIG. 11 is a simplified block diagram of a decoder device according to an example of the present invention. As shown, device 1100 includes multiplexers 1110 and 1170, permutation blocks 1120 and 1140, a plurality of CNPUs 1130, a plurality of VNPUs 1150, a FIFO unit 1180, and a control unit 1190. The first multiplexer 1110 is coupled to the first permutation block 1120, which is coupled to the plurality of CNPUs 1130. The CNPUs 1130 are coupled to the second (inverse) permutation block 1140, which is coupled to the plurality of VNPUs 1150. The plurality of VNPUs 1150 are coupled in a first feedback loop 1162 to the first multiplexer 1110. The second multiplexer 1170 is coupled to the FIFO unit 1180, which is coupled to the plurality of VNPUs 1150 and coupled in second feedback loop 1164 back to the second multiplexer 1170. Both multiplexers 1110 and 1170 receive the prior LLR values as inputs, and through the computations directed by the control unit 1190 this decoding process can iteratively process multiple codewords in parallel.

In an example, the control unit 1190 generates control signals used by the other blocks of decoder 1100. In particular, the control unit 1190 controls the select lines of the multiplexers 1110, 1170 and the permutation blocks 1120, 1140. The first multiplexer 1110 and the first permutation block 1120 are configured to select the appropriate inputs to the CNPUs 1130, while the second (inverse) permutation block 1140 is configured to receive the outputs of the CNPUs 1130 and select the appropriate inputs to the VNPUs 1150. Further, the control unit 1190 also turns on and off post-processing algorithms implemented by the CNPUs 1130 or the VNPUs 1150 and the computations and memories in the CNPUs 1130 (as described for FIG. 10). The second multiplexer 1170 provides LLR values to the FIFO unit 1180, which outputs these values for computations by the VNPUs 1150 that also results in the computations of a posteriori LLR values, as discussed for FIG. 7. The feedback paths 1162, 1164 provide intermediate values to the beginning of this pipelined configuration to perform additional iterations of this iterative decoding process. Of course, there can be variations, modifications, and alternatives.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A decoder circuit configured to decode data including codewords encoded with an error correction code, the decoder circuit comprising:
a first decoder, wherein the first decoder is a first type of decoder configured to decode and eliminate errors from the data in accordance with a first performance level and a first level of power consumption, the first decoder being configured to (i) receive the data encoded with the error correction code and (ii) decode and eliminate errors from a first subset of the codewords encoded with the error correction code; and
a second decoder, wherein the second decoder is a second type of decoder configured to decode and eliminate errors from the data in accordance with a second performance level greater than the first performance level and a second level of power consumption greater than the first level of power consumption, the second decoder being configured to (i) receive the data received by the first decoder encoded with the error correction code and (ii) decode and eliminate errors from a second subset of the codewords without attempting to decode and eliminate errors from the first subset of the codewords, the second subset of the codewords being different from the first subset of the codewords and encoded with the error correction code, and each of the first subset of codewords and the second subset of codewords comprising one or more codewords.

2. The decoder circuit of claim 1, wherein the first subset of the codewords is associated with a first level of complexity and the second subset of the codewords is associated with a second level of complexity greater than the first level of complexity.

3. The decoder circuit of claim 2, wherein the first decoder is not configured to be able to decode and eliminate errors from the second subset of the codewords.

4. The decoder circuit of claim 1, wherein the first decoder is configured to decode and eliminate errors from the data in accordance with the first performance level at a first word error rate and the second decoder is configured to decode and eliminate errors from the data in accordance with the second performance level at a second word error rate, the second word error rate being less than the first word error rate.

5. The decoder circuit of claim 1, wherein the first decoder is configured to decode and eliminate errors from the data in accordance with the first performance level at a first rate of decoding and the second decoder is configured to decode and eliminate errors from the data in accordance with the second performance level at a second decoding rate, the second rate of decoding being greater than the first rate of decoding.

6. The decoder circuit of claim 1, wherein the first decoder is a hard decision decoder or a soft bit-flipping decoder and the second decoder is a soft decision decoder.

7. The decoder circuit of claim 1, wherein (i) the first decoder and the second decoder are coupled in series and (ii) the second decoder receives the data from the first decoder.

8. The decoder circuit of claim 1, wherein the second decoder is configured to decode and eliminate errors from the second subset of the codewords in response to the first decoder being unable to decode and eliminate errors from the second subset of the codewords.

9. The decoder circuit of claim 8, wherein the second decoder is configured to be in a sleep state while the first decoder attempts to decode and eliminate errors from the second subset of the codewords and to transition out of a sleep state in response to the first decoder being unable to decode and eliminate errors from codewords forming the second subset of the codewords.

10. The decoder circuit of claim 1, further comprising a third decoder, wherein the third decoder is configured to decode and eliminate errors from the data in accordance with a third performance level greater than the first performance level and the second performance level, the third decoder being configured to (i) receive the data encoded with the error correction code and (ii) decode and eliminate errors from a third subset of the codewords, different from the first subset and the second subset of the codewords, encoded with the error correction code without attempting to decode and eliminate errors from the first subset and the second subset of the codewords.

11. The decoder circuit of claim 1, further comprising a classifier circuit configured to (i) receive the data, (ii) classify the data into either the first subset of the codewords or the second subset of the codewords based on a complexity of the data, and (iii) selectively direct the first subset of the codewords to the first decoder and the second subset of the codewords to the second decoder based on the classifying.

12. The decoder circuit of claim 11, wherein the classifier circuit is configured to classify the data using at least one of (i) pre-forward error correction bit error rate metrics, a transition probability stochastic matrix, and mutual information metrics.

13. The decoder circuit of claim 11, further comprising a switch coupled to inputs of the first decoder and the second decoder, wherein the classifier circuit is configured to control the switch to selectively direct the first subset of the codewords to the first decoder and the second subset of the codewords to the second decoder.

14. The decoder circuit of claim 1, wherein the first decoder and the second decoder are configured as finite state machine (FSM) having a plurality of states, each of the first decoder and the second decoder being associated with (i) a respective state of the plurality of states of the FSM and (ii) a respective decoding algorithm from a predetermined set of decoding algorithms.

15. A decoder circuit configured to decode data including codewords encoded with an error correction code, the decoder circuit comprising:

a first decoder, wherein the first decoder is a first type of decoder configured to decode and eliminate errors from the data in accordance with a first performance level and a first level of power consumption, the first decoder being configured to (i) receive the data encoded with the error correction code and (ii) decode and eliminate errors from a first subset of the codewords encoded with the error correction code; and a second decoder, wherein the second decoder is a second type of decoder configured to decode and eliminate errors from the data in accordance with a second performance level greater than the first performance level and a second level of power consumption greater than the first level of power consumption, the second decoder being configured to (i) receive the data encoded with the error correction code and (ii) decode and eliminate errors from a second subset of the codewords without attempting to decode and eliminate errors from the first subset of the codewords, the second subset of the codewords being different from the first subset of the codewords and encoded with the error correction code, wherein the second decoder is configured to be in a sleep state while the first decoder attempts to decode and eliminate errors from the second subset of the codewords and to transition out of a sleep state in response to the first decoder being unable to decode and eliminate errors from codewords forming the second subset of the codewords.

16. The decoder circuit of claim 15, wherein the second decoder is configured to decode and eliminate errors from the second subset of the codewords in response to the first decoder being unable to decode and eliminate errors from the second subset of the codewords.

* * * * *